(12) United States Patent
Yamanaka et al.

(10) Patent No.: US 8,691,674 B2
(45) Date of Patent: Apr. 8, 2014

(54) METHOD FOR PRODUCING GROUP 3-5 NITRIDE SEMICONDUCTOR AND METHOD FOR PRODUCING LIGHT-EMITTING DEVICE

(75) Inventors: Sadanori Yamanaka, Tokyo (JP); Kazumasa Ueda, Tsuchiura (JP); Yoshihiko Tsuchida, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 11/992,653

(22) PCT Filed: Sep. 27, 2006

(86) PCT No.: PCT/JP2006/319822
§ 371 (c)(1),
(2), (4) Date: Mar. 27, 2008

(87) PCT Pub. No.: WO2007/037504
PCT Pub. Date: Apr. 5, 2007

(65) Prior Publication Data
US 2009/0117675 A1 May 7, 2009

(30) Foreign Application Priority Data

Sep. 29, 2005 (JP) ................. 2005-283155

(51) Int. Cl.
*H01L 21/20* (2006.01)
*H01L 21/36* (2006.01)

(52) U.S. Cl.
USPC ............... 438/507; 438/22; 438/458; 257/79; 257/E21.463; 257/E33.001

(58) Field of Classification Search
USPC ............... 438/22–47, 455–459, 507; 257/E33.023–E33.034, 257/E21.119–E21.122, E21.463, 9–22, 257/79–103, 431–437, E33.001–E33.077
See application file for complete search history.

(56) References Cited

U.S. PATENT DOCUMENTS 6,177,359 B1 1/2001 Chen et al.
6,413,627 B1 7/2002 Motoki et al.
(Continued)

FOREIGN PATENT DOCUMENTS

GB 2438567 A 11/2007
JP 2001501778 2/2001
(Continued)

OTHER PUBLICATIONS

Akira Usui et al., "Thick GaN Epitaxial Growth with Low Dislocation Density by Hydride Vapor Phase Epitaxy," *Japanese Journal of Applied Physics*, vol. 36, No. 7B, Jul. 15, 1997, pp. L899-L902.

(Continued)

*Primary Examiner* — Julio J. Maldonado
*Assistant Examiner* — Sonya D McCall Shepard
(74) *Attorney, Agent, or Firm* — Fitch, Even, Tabin & Flannery LLP (57) ABSTRACT

A method for producing a group 3-5 nitride semiconductor includes the steps of (i), (ii), (iii) in this order: (i) placing inorganic particles on a substrate, (ii) epitaxially growing a semiconductor layer by using the inorganic particles as a mask, and (iii) separating the substrate and the semiconductor layer by irradiating the interface between the substrate and the semiconductor layer with light; and a method for producing a light emitting device further includes adding electrodes.

15 Claims, 3 Drawing Sheets

(56) References Cited

U.S. PATENT DOCUMENTS

| | | |
|---|---|---|
| 6,559,075 B1 | 5/2003 | Kelly et al. |
| 6,682,657 B2 | 1/2004 | Dutton et al. |
| 7,968,897 B2 | 6/2011 | Hata et al. |
| 2002/0137342 A1 | 9/2002 | Ishida et al. |
| 2002/0155712 A1 | 10/2002 | Urashima et al. |
| 2003/0064569 A1* | 4/2003 | Takayama et al. ............ 438/455 |
| 2003/0104678 A1 | 6/2003 | Kelly et al. |
| 2003/0143771 A1 | 7/2003 | Kidoguchi et al. |
| 2003/0183160 A1 | 10/2003 | Fujikura et al. |
| 2004/0048448 A1 | 3/2004 | Koike et al. |
| 2004/0072382 A1 | 4/2004 | Kelly et al. |
| 2005/0179130 A1 | 8/2005 | Tanaka et al. |
| 2005/0199885 A1 | 9/2005 | Hata et al. |
| 2005/0199901 A1* | 9/2005 | Ueda ............................ 257/103 |
| 2005/0282357 A1 | 12/2005 | Takayama et al. |
| 2006/0033119 A1* | 2/2006 | Shibata ......................... 257/103 |
| 2006/0189020 A1* | 8/2006 | Kim ................................ 438/47 |
| 2006/0205197 A1* | 9/2006 | Yi et al. ........................ 438/590 |
| 2009/0008652 A1* | 1/2009 | Ueda et al. ..................... 257/79 |

FOREIGN PATENT DOCUMENTS

| | | |
|---|---|---|
| JP | 2001176813 | 6/2001 |
| JP | 2003-163337 A | 6/2003 |
| JP | 2004-055799 A | 2/2004 |
| JP | 2005-259768 A | 9/2005 |
| JP | 2007-59762 A | 3/2007 |
| JP | 2000-223743 A | 8/2008 |
| WO | WO 98/14986 | 4/1998 |

OTHER PUBLICATIONS

Office Action dated Mar. 21, 2011 in U.S. Appl. No. 12/224,984, filed Sep. 11, 2008.

Office Action, KR, Aug. 27, 2012, Yamanaka, Sadanori.

Office Action dated Jul. 12, 2011, corresponding with Japanese Application 2006-261844 (partial English translation).

KR Office Action dated Mar. 26, 2013, corresponding with KR Patent Application 10-2008-7009907 (English translation).

* cited by examiner

Fig. 3

METHOD FOR PRODUCING GROUP 3-5 NITRIDE SEMICONDUCTOR AND METHOD FOR PRODUCING LIGHT-EMITTING DEVICE

CROSS-REFERENCE TO RELATED APPLICATION

This is a U.S. National Phase of International Application PCT/JP2006/319822, filed Sep. 27, 2006, and claims the benefit of foreign priority under 35 U.S.C. §119 based on JP 2005-283155, filed Sep. 29, 2005, the entire disclosures of which applications are hereby incorporated herein by reference.

TECHNICAL FIELD

The present invention relates to a method for producing a group 3-5 nitride semiconductor and a method for producing a light emitting device.

BACKGROUND ART

A group 3-5 nitride semiconductor widely used for blue LEDs and so on and represented by the formula $In_xGa_yAl_zN$ ($0 \leq x \leq 1$, $0 \leq y \leq 1$, $0 \leq z \leq 1$, and $x+y+z=1$) is usually grown on a substrate for growth. The substrate for growth (hereinafter referred to as "substrate") is usually made of sapphire; the group 3-5 nitride semiconductor is epitaxially grown on the sapphire substrate by metalorganic vapor phase epitaxy (MOVPE) or the like.

As group 3-5 nitride semiconductors are widely used for LEDs, they have been required to have high light emission output.

As a light emitting device with high light emission output, a group 3-5 nitride semiconductor having no sapphire substrate has been proposed.

If a sapphire substrate is removed from a conventional group 3-5 nitride semiconductor light emitting device including sapphire substrate, group 3-5 nitride semiconductor layer with a GaN layer and formed on the sapphire substrate, and two electrodes formed thereon, heat release is not shielded by the sapphire substrate. Because of this, the light emitting device can be driven at a high current density and, therefore, is expected to have a high light emission output; and besides since electric current is not shielded by the sapphire substrate, whereby it becomes possible to produce a vertical light emitting device in which electrodes are provided to both ends of a group 3-5 nitride semiconductor layer, and therefore it is expected that the degree of freedom in the structures of light emitting devices is heightened.

At present, a study of a method for producing a group 3-5 nitride semiconductor having no sapphire substrate has been made. However, since a bulk crystal growth is difficult to attain, no method for industrially producing a free standing substrate, in particular, a conductive free standing substrate is in actual use; also, no method for producing a group 3-5 nitride semiconductor having a free standing substrate has been developed.

Instead, various methods for producing a group 3-5 nitride semiconductor, in which the group 3-5 nitride semiconductor is grown on a sapphire substrate and both are then separated, have been proposed (see JP-W No. 2001-501778 and JP-A 2001-176813).

In the methods disclosed in these references, however, it was not possible to separate the group 3-5 nitride semiconductor and the substrate, and no light emitting device with sufficient light emission output was obtained due to damage to the group 3-5 nitride semiconductor caused at its separation step.

DISCLOSURE OF THE INVENTION

An object of the present invention is to provide a method for producing a group 3-5 nitride semiconductor having no substrate and suitably used for a light emitting device and a method for producing a light emitting device.

The present inventors conducted extensive studies of a method for producing a group 3-5 nitride semiconductor in order to solve the above problems. As a result, the present invention has been accomplished.

That is, the invention provides a method for producing a group 3-5 nitride semiconductor comprising the steps of (i), (ii), and (iii) in this order;
(i): placing inorganic particles on a substrate,
(ii): growing a semiconductor layer, and
(iii): separating the substrate and the semiconductor layer by irradiating the interface between the substrate and the semiconductor layer with light.

The invention also provides a method for producing a light emitting device comprising the above steps (i), (ii), and (iii) and the step (iv) in this order:
(iv): forming electrodes.

EXPLANATION OF REFERENCES

1 SUBSTRATE
1A surface of substrate
1B growth region of semiconductor layer
2 inorganic particle
3 semiconductor layer (group 3-5 nitride)
11 substrate
12 buffer layer
13 n-type layer
14 active layer
14A to 14F barrier layer
14G to 14J well layer
14K cap layer
15 p-type layer
21 substrate
22 inorganic particle
23 semiconductor layer (group 3-5 nitride)
24 positive electrode
25 adherence-enhancing layer
26 adhesion layer
27 electrically conductive support
28 negative electrode

MODE OF CARRYING OUT THE INVENTION

Method For Producing Group 3-5 Nitride Semiconductor

A method for producing a group 3-5 nitride semiconductor according to the present invention includes the step (i) of placing inorganic particles on a substrate.

The substrate is made of, for example, sapphire, SiC, Si, $MgAl_2O_4$, $LiTaO_3$, $ZrB_2$, $CrB_2$, GaN, or AlN. As will be described later, when the substrate has light transparency, energy can be efficiently conveyed to the vicinity of an interface between the substrate and the group 3-5 nitride semiconductor. From this point of view, the substrate is preferably made of sapphire, GaN, or AlN and more preferably made of sapphire. And further, from the viewpoint of its reactivity to the group 3-5 nitride semiconductor, the difference between their coefficients of thermal expansion, its good high-temperature stability, the easy availability of wafers, and so on, the substrate is preferably made of sapphire or SiC and more preferably made of sapphire.

From the viewpoint of the above, it is further preferable that the substrate is made of sapphire.

The inorganic particles are made of, for example, oxide, nitride, carbide, boride, sulfide, selenide, or metal.

Examples of the oxide include silica, alumina, zirconia, titania, ceria, zinc oxide, tin oxide, and yttrium aluminum garnet (YAG).

Examples of the nitride include silicon nitride, aluminum nitride, and boron nitride.

Examples of the carbide include silicon carbide (SiC), boron carbide, diamond, graphite, and fullerenes.

Examples of the boride include zirconium boride ($ZrB_2$) and chromium boride ($CrB_2$).

Examples of the sulfide include zinc sulfide, cadmium sulfide, calcium sulfide, and strontium sulfide.

Examples of the selenide include zinc selenide and cadmium selenide.

In the oxide, the element other than the element oxygen may be partially substituted with another element; the same holds true for the nitride, carbide, boride, sulfide, and selenide. Examples of the oxide in which the element other than the element oxygen is partially substituted with another element include phosphors of silicate and aluminate including cerium or europium as an activator.

Examples of the metal include silicon (Si), nickel (Ni), tungsten (W), tantalum (Ta), chromium (Cr), titanium (Ti), magnesium (Mg), calcium (Ca), aluminum (Al), gold (Au), silver (Ag), and zinc (Zn).

The inorganic particles may be made of a material which is converted into the above oxide, nitride, carbide, boride, sulfide, selenide, or metal when heat-treated; for example, may be made of silicone. Silicone is a polymer having a structure in which Si—O—Si inorganic bonds are formed as a main skeleton and organic substituents are present instead of the Si atoms; the silicone is converted into silica when heated to a temperature of about 500° C.

The inorganic particles may include particles of one of the above inorganic substances, a mixture of two or more of them, or a composite comprised of two or more of them. The inorganic particles include made of one of the above inorganic substance include preferably oxide particles, and more preferably silica particles.

The inorganic particles may have a shape of sphere (for example, circular or elliptic cross section), plate (with an aspect (length L-to-thickness T) ratio of 1.5 to 100), needle (with a length-to-width (L/W) ratio of 1.5 to 100, for example), or no definite shape (the inorganic particles have various shapes, and they fail to be unique in shape as a whole), preferably a shape of sphere. Therefore the inorganic particles are more preferably spherical silica particles. As the spherical silica particles, the use of silica particles included in colloidal silica is recommended from the viewpoint of easy availability of monodisperse silica particles with controlled diameters. Colloidal silica is a suspension in which silica particles are dispersed into a solvent (such as water) in colloidal form; such a suspension may be prepared through the ion exchange of sodium silicate or the hydrolysis of an organosilicon compound such as tetraethyl orthosilicate (TEOS).

The inorganic particles has an average particle diameter of usually from 5 nm to 50 µm, preferably from 10 nm to 10 µm, and more preferably from 20 nm to 1 µm. When falling within the range of the average particle diameter, the inorganic particles of different particle diameters may be used together. The average particle diameter refers to their volumetric average particle diameter measured by centrifugal sedimentation. The average particle diameter may be measured by a measurement method other than centrifugal sedimentation, such as dynamic light-scattering method, Coulter counter method, laser diffractometry, or electron microscopy; in that case, it is required only to calibrate the measured average particle diameter and then convert it into the volumetric average particle diameter measured by centrifugal sedimentation. For example, the average particle diameter of average ones of the particles is determined by centrifugal sedimentation and another particle size measurement method, and then the correlation coefficient of both the determined average particle diameters is calculated. It is preferable that the correlation coefficient is determined by drawing a calibration curve through the calculation of the correlation coefficient to the volumetric average particle diameter of the plural average particles of different particle diameters measured by centrifugal sedimentation. The use of the calibration curve makes it possible to determine the volumetric average particle diameter from the average particle diameter determined by a measurement method other than centrifugal sedimentation.

The placement may be carried out by, for example, a method of dipping the substrate in a slurry containing the inorganic particles and a medium, or a method of applying or spraying the slurry onto the substrate and then drying the slurry. Examples of the medium include water, methanol, ethanol, isopropanol, n-butanol, ethylene glycol, dimethylacetamide, methyl ethyl ketone, and methyl isobutyl ketone; preferably water. The application is preferably carried out by spin coating, which makes it possible to uniform the placement density of the inorganic particles. The drying may be carried out with a spinner.

The coverage of the inorganic particles on the substrate may be determined from the following expression:

$$\text{the coverage}(\%) = ((d/2)^2 \times \pi \cdot P \cdot 100)/S$$

wherein d is the average particle diameter of the inorganic particles and P is the number of the particles present within a measurement visual field (area S) of Scanning electron microscope (SEM) image top view of the substrate on which the inorganic particles are placed.

When the inorganic particles are made of one of the above inorganic substances, the coverage of the inorganic particles to the substrate is usually from 1% to 95%, preferably 30% or higher, and more preferably 50% or higher.

Inorganic particles are usually placed on a substrate as a monolayer because a semiconductor layer is easy to planarize through its epitaxial growth. If a semiconductor layer is planarized through its epitaxial growth, they may be placed thereon as more than one layer; inorganic particles of one kind may be placed as at least two layers, or inorganic particles of at least two kinds may be placed individually as a monolayer.

The method according to the invention includes the step (ii) of growing a semiconductor layer, that is, usually includes the step (ii) of growing a semiconductor layer on the substrate and the inorganic particles placed at the step (i).

The semiconductor layer is usually made of group 3-5 nitride and preferably nitride represented by the formula $In_xGa_yAl_zN$ ($0 \leq x \leq 1$, $0 \leq y \leq 1$, $0 \leq z \leq 1$, and $x+y+z=1$). The semiconductor layer may be grown in the form of single layer or two layers or more. And further, the semiconductor layer may include, for example, a layer required for the operation of a nitride semiconductor light emitting device and a monolayer or multilayer (such as a thick-film layer and a superlattice thin-film layer) to obtain the layer with high-quality crystal.

Additionally, from the viewpoint of easy separation of the substrate therefrom, impurities, deficits, and the like may be introduced into a semiconductor layer adjacent to the substrate or a semiconductor layer near the substrate in the semiconductor layer at the step (iii) described later. Examples of the semiconductor layer include low temperature (500° C.) grown buffer layer (such as InGaN layer and GaN layer). When the buffer layer is made of GaN, the buffer layer has a thickness of usually from 10 Å to 5000 Å, preferably from 100 Å to 1000 Å, more preferably from 300 Å to 700 Å.

In addition, in the semiconductor layer, either a facet structure may be formed or the structure does not have to be formed; when the coverage of the inorganic particles thereto is high, preference is given to the semiconductor layer with the facet structure, for it is easy to planarize.

As described above, the semiconductor layer usually includes the n-type layer, the active layer, and the p-type layer in this order and, if required, includes the buffer layer. And further, since the active layer includes, for example, a barrier layer, a well layer, and a cap layer, the step (ii) may include a buffer layer-growing substep, an n-type layer-growing substep, an active layer-growing substep, a p-type layer-growing substep, a barrier layer-growing substep, a well layer-growing substep, or a cap layer-growing substep.

Growth may be carried out by metalorganic vapor phase epitaxy (MOVPE), molecular beam epitaxy (MBE), hydride vapor phase epitaxy (HVPE), or the like.

When the group 3-5 nitride semiconductor layer is grown by MOVPE, the growth may be carried out by a method of charging the following group 3 material and group 5 material into a reactor through the use of a carrier gas.

Examples of the group 3 material include:
trialkyl gallium represented by the formula $R_1R_2R_3Ga$ [where $R_1$, $R_2$, and $R_3$ are lower alkyl groups] such as trimethyl gallium [TMG $(CH_3)_3Ga$] and triethyl gallium [TEG $(C_2H_5)_3Ga$];
trialkyl aluminum represented by the formula $R_1R_2R_3Al$ [where $R_1$, $R_2$, and $R_3$ are lower alkyl groups] such as trimethyl aluminum [TMA $(CH_3)_3Al$], triethyl aluminum [TEA $(C_2H_5)_3Al$], and triisobutyl aluminum [$(i-C_4H_9)_3Al$]; trimethylaminealane [$(CH_3)_3N:AlH_3$];
trialkyl indium represented by the formula $R_1R_2R_3In$ [where $R_1$, $R_2$, and $R_3$ are lower alkyl groups] such as trimethyl indium [TMI $(CH_3)_3In$] and triethyl indium [$(C_2H_5)_3In$];
compounds given by substituting one or two alkyl groups of trialkyl indium with one or two halogen atoms such as diethyl indium chloride [$(C_2H_5)_2InCl$]; and
indium halide represented by the formula InX [where X is a halogen atom] such as
indium chloride [InCl].

These materials may be used alone or in combination. Among the group 3 materials, TMG is preferred as the gallium source, TMA is preferred as the aluminum source, and TMI is preferred as the indium source.

Examples of the group 5 material include ammonia, hydrazine, methylhydrazine, 1,1-dimethylhydrazine, 1,2-dimethylhydrazine, t-butylamine, and ethylenediamine. These materials may be used alone or in combination. Among the group 5 materials, preference is given to ammonia and hydrazine, and much preference is given to ammonia.

Examples of the n-type dopant include Si and Ge. Examples of a material used as the n-type dopant include silane, disilane, germane, and tetramethyl germanium.

Examples of the p-type dopant include Mg, Zn, Cd, Ca, and Be; preference is given to Mg and Ca. Examples of a Mg-based material used as the p-type dopant include
bis(cyclopentadienyl)magnesium [$(C_5H_5)_2Mg$],
bis(methylcyclopentadienyl)magnesium [$(C_5H_4CH_3)_2Mg$], and
bis(ethylcyclopentadienyl)magnesium [$(C_5H_4C_2H_5)_2Mg$].
Examples of a Ca-based material used as the p-type dopant include:
bis(cyclopentadienyl)calcium [$(C_5H_5)_2Ca$] and derivatives thereof such as
bis(methylcyclopentadienyl)calcium [$(C_5H_4CH_3)_2Ca$],
bis(ethylcyclopentadienyl)calcium [$(C_5H_4C_2H_5)_2Ca$], and
bis(perfluorocyclopentadienyl)calcium [$(C_5F_5)_2Ca$];
di-(1-naphthalenyl)calcium and derivatives thereof; and calcium acetylide and derivatives thereof such as
bis(4,4-difluore-3-butene-1-inyl)-calcium and
bis(phenylethynyl)calcium.

These materials may be used alone or in combination.

Examples of an atmospheric gas used during the growth and the carrier gas for the material include nitrogen, hydrogen, argon, and helium; preference is given to hydrogen and helium. These gases may be used alone or in combination.

The reactor includes usually a susceptor and a supply line through which the materials are supplied from a storage container to the reactor. The susceptor is a device which heats the substrate, and is placed in the reactor; and besides the susceptor usually rotates on power to grow the semiconductor layer uniformly. The susceptor has a heater such as an infrared lamp inside. Through the use of the heater, the materials supplied through the supply line to the reactor are pyrolyzed on the substrate, whereby the semiconductor layer is vapor-grown on the substrate. Of the materials supplied to the reactor, unreacted material is usually discharged from the reactor to the outside through a discharge line and then sent to a waste gas treatment unit.

When the group 3-5 nitride semiconductor layer is grown by HVPE, the growth may be carried out by a method of charging the following group 3 material and group 5 material into the reactor through the use of a carrier gas.

Examples of the group 3 material include gallium chloride gas formed by reacting gallium metal and hydrogen chloride gas at a high temperature and indium chloride gas formed by reacting indium metal and hydrogen chloride gas at a high temperature.

Examples of the group 5 material include ammonia.

Examples of the carrier gas include nitrogen, hydrogen, argon, and helium; preference is given to hydrogen and helium. These gases may be used alone or in combination.

When the group 3-5 nitride semiconductor layer is grown by MBE, the growth of the semiconductor layer may be carried out by a method of charging the following group 3 material gas and group 5 material into the reactor.

Examples of the group 3 material include metals such as gallium, aluminum, and indium.

Examples of the group 5 material include gases such as nitrogen and ammonia.

At the step (ii), the semiconductor layer usually begins to be grown in such a way that places where the inorganic particles are not present are used as a growth region, and then the facet structure is formed.

In addition, at the step (ii), the surface of the semiconductor layer may be planarized; for example, by accelerating its lateral growth, the surface may be planarized in such a way that the facet structure of the substrate obtained by growing the semiconductor layer while forming the facet structure is embedded in the layer. By carrying out such growth, dislocation having reached the facets is bent laterally, the inorganic particles are buried in the semiconductor layer, and the semiconductor layer with reduced deficits is obtained.

The method according to the invention further includes the step (iii) of separating the substrate and the group 3-5 nitride semiconductor layer by irradiating the portion between them with light, that is, usually includes the step (iii) of separating the substrate and the semiconductor layer by decomposing part of the group 3-5 nitride semiconductor through the light irradiation of the resultant obtained at the step (ii).

The light used for the irradiation may give energy enough to allow the group 3-5 nitride semiconductor layer to be decomposed. The light is preferably laser light from the viewpoint of making the group 3-5 nitride semiconductor efficiently absorb the energy for the decomposition. The light usually has a wavelength absorbed by the group 3-5 nitride semiconductor and energy higher in level than the band gap of the group 3-5 nitride semiconductor. When the group 3-5 nitride semiconductor is made of GaN (with a band gap of about 3.4 eV), light emitted therefrom has preferably a wavelength shorter than 365 nm. Examples of the laser light include triple harmonics from YAG and $YVO_4$ lasers (with a wavelength of 355 nm), quadruple harmonics from YAG and $YVO_4$ lasers (with a wavelength of 266 nm), and laser lights emitted with excimers from ArF, KrF, and XeCl lasers (their wavelengths are 193, 248, and 308 nm, respectively); from the viewpoint of uniformity in energy, preferably light from a YAG or $YVO_4$ laser.

When the absorption into the group 3-5 nitride semiconductor is enhanced by introducing a level in the band gap through the introduction of impurities, deficits, and so on into the semiconductor, radiation light may have energy lower in level than its band gap.

When laser light is used, its oscillation forms include continuous oscillation, normal pulse oscillation, and Q-switching pulse oscillation; from the viewpoint of reduction in thermal effect, preferably CW-excited Q-switching pulse oscillation with a short pulse on the order of nanoseconds and a high-peak power.

In order to efficiently decompose the group 3-5 nitride semiconductor, it is preferable that the light has a large absorption region. The light supplies energy in the shape of spot, line, area, or the like near the interface between the substrate and the group 3-5 nitride semiconductor. When the light is laser light in the shape of spot or line, it is preferable that the focus of the light incident from the substrate side is changed (the light is defocused) a little from the interface between the substrate and the group 3-5 nitride semiconductor to the group 3-5 nitride semiconductor side from the viewpoint of reducing the time taken to separate the substrate therefrom. Since energy supplied by laser light has a spatial distribution, it is preferable that the energy is uniformly supplied to the interface between the substrate and the group 3-5 nitride semiconductor by overlapping its irradiation regions from the viewpoint of the separation between the substrate and the group 3-5 nitride semiconductor (such as group 3-5 nitride semiconductor about 2 inches in diameter). It is preferable that the inorganic particles are placed in the penetration region of laser light because the substrate is separated more efficiently therefrom with low energy.

The method according to the invention may include the step in which the inorganic particles left on the surface (e.g., the release surface) of the group 3-5 nitride semiconductor are removed after the separation of substrate at the step (iii). The removal may be carried out by, for example, chemical processing such as etching or physical processing such as grinding or polishing.

An embodiment of the method for producing a group 3-5 nitride semiconductor according to the invention will be described with reference to FIG. 1.

Figure 1:
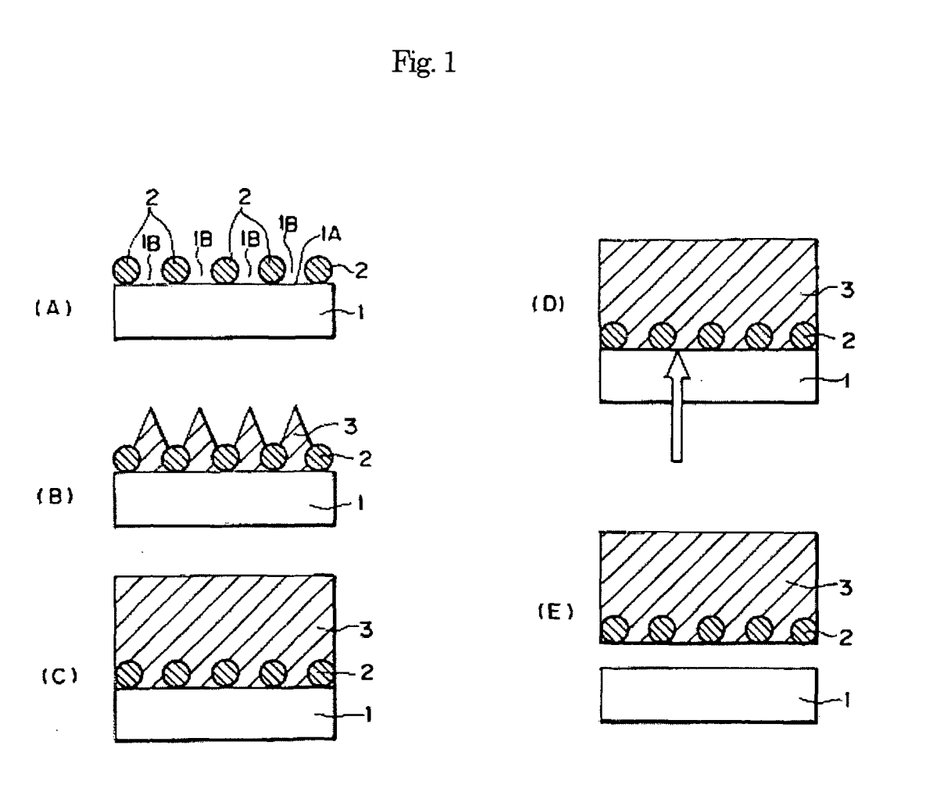
FIG. 1 illustrates an example of a method for producing a group 3-5 nitride semiconductor according to the present invention.

At the step (i), inorganic particles 2 are placed on a substrate 1 as shown in FIG. 1(A).

At the step (ii), the inorganic particles 2 (e.g., silica particles) placed on the substrate 1 (e.g., sapphire) serve as a mask during the growth of a semiconductor layer 3 (e.g., a group 3-5 nitride such as GaN), whereby places in the surface 1A of the substrate 1 where the inorganic particles 2 are not placed are used as a growth region 1B. When a material gas and so on needed to grow the semiconductor layer 3 are supplied onto the substrate 1 on which the inorganic particles 2 are placed to carry out its epitaxial growth, the semiconductor layer 3, as shown in FIG. 1(B), grows from the growth region 1B in such a way that the inorganic particles 2 are embedded therein. When the epitaxial growth is further continued, the group 3-5 nitride semiconductor, 3, as shown in FIG. 1(C), grows in such a way that the inorganic particles 2 are embedded in the semiconductor layer 3. When the semiconductor layer 3 is grown on the substrate 1 on which the inorganic particles 2 are placed while forming a facet structure as shown in FIG. 1(B), and then the semiconductor layer 3 is planarized with the facet structure embedded therein by accelerating its lateral growth as shown in FIG. 1(C), dislocations having reached the facets are bent laterally. Because of this, the inorganic particles 2 is placed in such a way that the inorganic particles 2 are buried in the semiconductor layer 3, and therefore the group 3-5 nitride semiconductor with a high degree of crystallinity is obtained.

At the step (iii), as shown in FIG. 1(D) light is irradiated from the substrate 1 side. When the light is a triple harmonic from a $YVO_4$ laser (with a wavelength of 355 nm), the light is not effectively absorbed into the substrate 1; the light is absorbed into the semiconductor layer 3. When the semiconductor layer 3 is pyrolyzed by the light irradiation, the group 3 material and nitrogen are deposited. When the semiconductor layer 3 is made of GaN, Ga is deposited; by heating the substrate 1 at higher than the melting point of Ga (30° C.), the substrate 1, as shown in FIG. 1(E), may be easily separated from the semiconductor layer 3.

In addition to the method for producing the group 3-5 nitride semiconductor in which the semiconductor layer 3, as shown in FIG. 1, is a single layer, the present invention includes a method for producing a group 3-5 nitride semiconductor in which the semiconductor layer 3 includes more than one layer.

Figure 2:
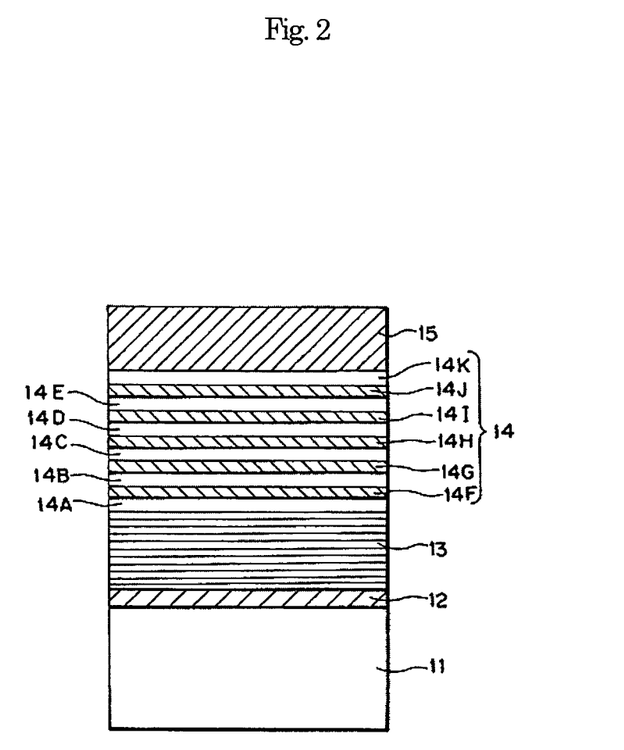
FIG. 2 illustrates the layered structure of the group 3-5 nitride semiconductor obtained by the producing method according to the invention.

As shown in FIG. 2, examples of such a method include a method of producing a group 3-5 nitride semiconductor comprised of epitaxially growing substrate 11, buffer layer 12 (made of, for example, InGaN, GaN, AlGaN, or AlN), n-type layer 13 (made of, for example, n-GaN or n-AlGaN), active layer 14, and p-type layer 15 (made of Mg-doped AlGaN or Mg-doped GaN) in this order. The active layer 14 includes barrier layers 14A to 14E (made of, for example, InGaN, GaN, or AlInGaN), well layers 14G to 14J (made of, for example, InGaN, GaN, or AlInGaN), and cap layer 14K (made of, for example, undoped GaN or undoped AlGaN).

The invention further includes a method therefor including, for example, the step (i') of placing inorganic particles on a GaN substrate, the step (ii') of growing an InGaN semiconductor layer and a GaN semiconductor layer thereon in that order, and the step (iii') of separating the GaN substrate and the InGaN semiconductor layer by light irradiation from the GaN substrate side. In this example, a layered structure including GaN substrate/InGaN semiconductor layer/GaN semiconductor layer is grown at the step (ii'); the region in which the inorganic particles are included is present in or near the InGaN semiconductor layer. When a double harmonic from the YVO$_4$ laser (with a wavelength of 532 nm) is irradiated from the GaN substrate side, the light is not absorbed into the GaN substrate but into the InGaN semiconductor layer. By light irradiation, the group 3 material and nitrogen are deposited in a region where the InGaN semiconductor layer is pyrolyzed. By heating the semiconductor at higher than the melting point of the group 3 material, the GaN substrate and the GaN semiconductor layer are recovered individually. The recovered GaN substrate and GaN semiconductor layer may be polished at their release surfaces to be utilized as substrates.

In this invention, when the substrate is made of sapphire and the semiconductor layer is made of GaN, a material with light transparency and thermal expansion coefficient lower than that of sapphire, such as AlN (with thermal expansion coefficient of $4.15 \times 10^{-6}$/°C.), may be deposited on the surface opposite to the GaN growth surface of the sapphire substrate. Such deposition makes it possible to reduce warpage caused at its producing step due to the difference in thermal expansion coefficient between sapphire and GaN (their thermal expansion coefficients are $7.5 \times 10^{-6}$/°C. and $5.59 \times 10^{-6}$/°C. (at 300K in direction perpendicular to the c-faces of the crystals), respectively).

In the producing method therefor according to the invention, the substrate and the semiconductor layer are separated by irradiation with light having relatively low energy, giving the group 3-5 nitride semiconductor. Since limitations on such processing placed by the energy are not strict, the productivity of the group 3-5 nitride semiconductor with a large area is increased.

Method for Producing Light Emitting Device

A method for producing a light emitting device according to the present invention includes the above steps (i), (ii), and (iii) and the step (iv) of forming electrodes.

The electrodes are a negative electrode and a positive electrode. The negative electrode contacts an n-type contact layer and is made of an alloy or compound that contains as a main component at least one selected from the group consisting of elements such as Al, Ti, and V; preferably Al, TiAl, and VAl. The positive electrode contacts a p-type contact layer and is made of, for example, NiAu or Ni/Au/Pt. The formation may be carried out using, for example, a vacuum coater. The formation may be usually carried out by vacuum deposition and photolithography with resist application, resist baking, pattern exposure, and pattern development.

An embodiment of the method for producing a light emitting device according to the invention is described with reference to FIG. 3. A light emitting device shown in FIG. 3, includes two electrodes on both surfaces of a group 3-5 nitride semiconductor which is connected to an electrically conductive support and allowed to be energized vertically.

Figure 3:
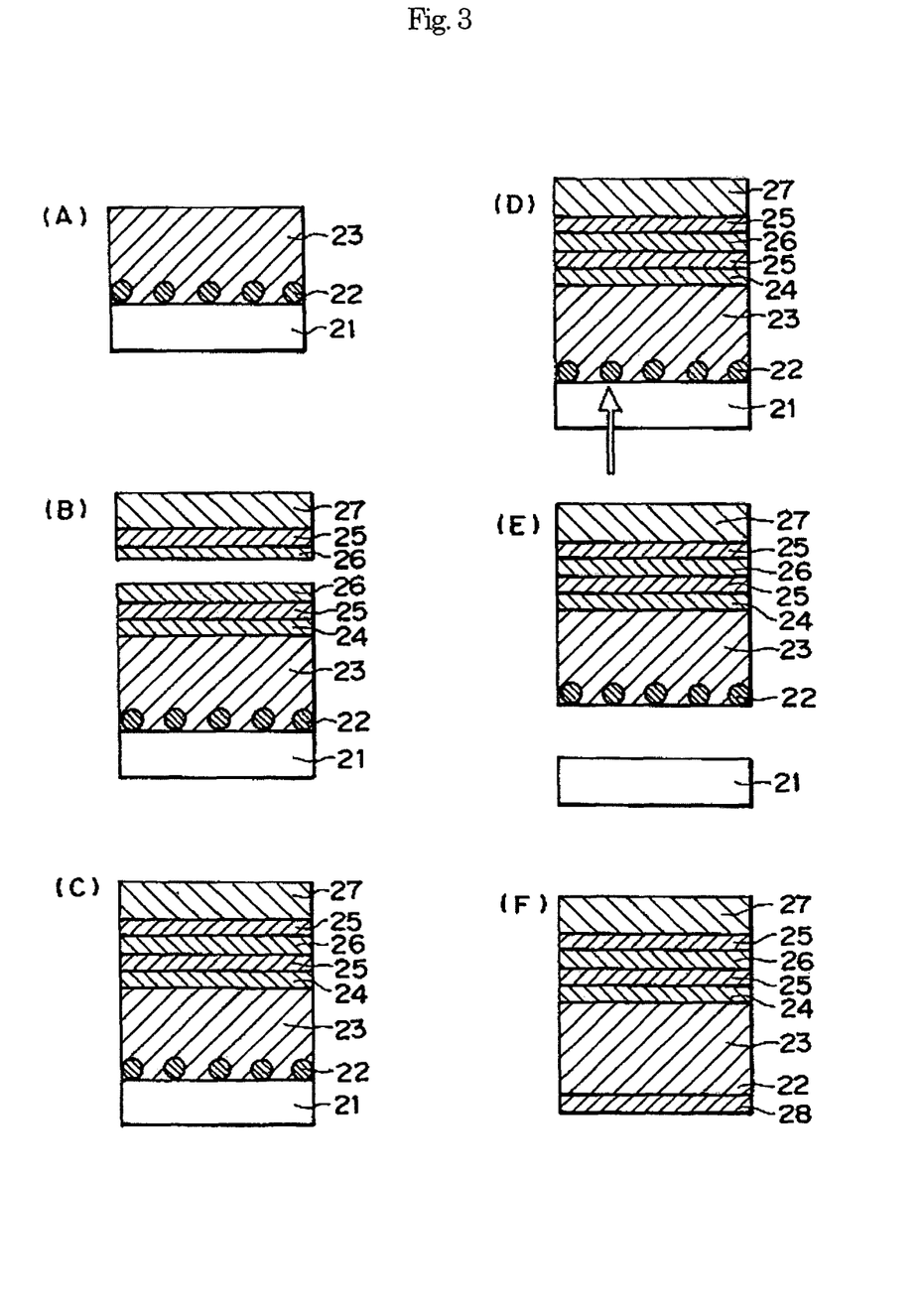
FIG. 3 illustrates an example of a method for producing a light emitting device according to the invention.

As shown in FIG. 3(A), by conducting the same operation as that described with reference to FIG. 1(A) to 1(C), inorganic particles 22 are placed on a substrate 21, and then a semiconductor layer 23 is grown thereon. When required, separation grooves are cut by etching the semiconductor layer 23 by photolithography/dry etching or laser processing until the grooves reach the substrate 21.

Thereafter, the surface of the semiconductor layer 23 is washed, and as shown in FIG. 3(B) an ohmic positive electrode 24 (made of, for example, Ni/Au or Ni/Au/Pt), an adherence-enhancing layer 25 (made of, for example, Ti/Pt), and an adhesion layer 26 (made of, for example, a soldering metal such as thermocompression bonding Au, Cu, or AuSn) are formed on the surface of the semiconductor layer 23 in that order.

An adherence-enhancing layer 25 same as the above is formed on an electrically conductive support 27. As shown in FIG. 3(B), it is preferable that the adherence-enhancing layer 25 and an adhesion layer 26 same as the above are formed on the electrically conductive support 27 in that order. Examples of the electrically conductive support 27 include semiconductors such as Si, GaAs, and SiC; metallic materials such as Cu, Al, W, Mo, Hf, La, Ta, Ir, Ru, Os, and Nb; preferably metallic material having a thermal expansion coefficient of $1.5 \times 10^{-6}$/°C. or lower, more preferably Mo. It is preferable that the electrically conductive support 27 has a surface which is mirror-polished and an average surface roughness of about 10 nm or less using a contact-type surface roughness meter. The electrically conductive support 27 has a thickness of preferably from about 30 to about 200 µm from the viewpoint of reduction in warpage.

As shown in FIG. 3(C), a multilayer substrate including the semiconductor layer 23, the ohmic positive electrode 24, the adherence-enhancing layer 25, the adhesion layer 26, (the adhesion layer 26), the adherence-enhancing layer 25, and the electrically conductive support 27 is obtained. The adhesion may be carried out by, for example, thermocompression bonding or adhesion with soldering metal.

As shown in FIG. 3(D), light is irradiated from the substrate 21 side, whereby, as shown in FIG. 3, the substrate 21 is separated therefrom.

Then, as shown in FIG. 3, an electrode 28 (such as a transparent electrode or a mesh electrode) is formed on the n-type layer to obtain a light emitting device in which the surface of the electrode 28 acts as a light emitting surface. The transparent electrode is made of, for example, ITO or ZnO. The size of the light emitting device, when required, may be adjusted by cutting or the like.

According to the invention, since damage to the semiconductor layer caused by the light irradiation is reduced, the light emitting device with a high light emission output is obtained. The light emitting device is suitably used for applications in which high brightness is required, such as illumination, outdoor display, and traffic lights in addition to indoor display.

EXAMPLES

The following example further illustrates the present invention. However, the example is not intended to limit the scope of the invention.

Example 1

As a substrate, a mirror polished c-face sapphire substrate was used. As inorganic particles, silica particles were used which were contained in colloidal silica (Trade Name "SEAHOSTAR KE-W50" manufactured by Nippon Shokubai Co., Ltd., average particle diameter: 550 nm). The substrate was set onto a spinner, the colloidal silica with a silica content of 20% by weight was applied onto the substrate, and the colloidal suspension was spin-dried. From the observation using a SEM, the coverage by the silica particles on the surface of the substrate was 60%.

A group 3-5 nitride semiconductor was epitaxially grown on the substrate by atmospheric pressure MOVPE under the following conditions and the silica particles were embedded in the group 3-5 nitride semiconductor layer. A GaN low-temperature buffer layer having a thickness of about 500 Å was grown thereon by supplying carrier gas, ammonia, and TMG under the conditions of pressure: 1 atmospheric pressure, susceptor temperature: 485° C., and carrier gas: hydrogen gas. An undoped GaN layer in which facets are to be formed was grown thereon by changing the susceptor temperature to 900° C. and supplying a carrier gas, ammonia, and TMG. An undoped GaN layer was grown by changing the susceptor temperature to 1040° C., changing the pressure to ¼ atmospheric pressure, and supplying carrier gas, ammonia, and TMG. Thereafter, an n-type layer made of GaN, barrier layers and well layers (with multiple quantum well structure) having a double heterostructure made of GaN and InGaN, cap layers made of GaN and AlGaN, and a p-type layer made of GaN were grown to obtain a group 3-5 nitride semiconductor which emitted blue light.

The group 3-5 nitride semiconductor was heat-treated under $N_2$ atmosphere at 700° C. for 20 minutes to make the p-type layer have a low electric resistance. Then photolithography with resist application, resist baking, pattern exposure (the formation of a pattern for element isolation), and pattern development was carried out on the surface of the group 3-5 nitride semiconductor. Thereafter, the semiconductor was ICP dry etched until separation grooves reached the sapphire substrate. The ICP dry etching was carried out under the conditions of etching gas: mixed gas of $Cl_2$, $CH_2Cl_2$, and Ar, gas flow rate: 20, 10, and 40 sccm, respectively, pressure: 0.8 Pa, ICP power: 200 W, and bias power: 100 W. After the dry etching, the extra mask was removed with an organic solvent.

To form an ohmic positive electrode on the surface of the epitaxial crystal which was subjected to the element isolation, the surface of the p-type epitaxial crystal was ultrasonically cleaned with an acetone solution, and cleaned with hot aqua regia (60° C.), and ultrasonically cleaned with ultrapure water. To form a NiAu electrode as the ohmic positive electrode, resist application, resist baking, pattern exposure, and pattern development were carried out on the surface of the crystal. Ni and Au were deposited thereon with a vacuum coater by 150 Å and 300 Å, respectively. An electrode pattern was formed by a lift-off method. A heat treatment under nitrogen atmosphere containing oxygen of 5% by volume was carried out at 500° C. for 10 minutes to obtain the NiAu ohmic positive electrode.

As a metal support, a plate of Mo was used which had a mirror-polished surface of average surface roughness of about 5 nm measured with a contact-type surface roughness meter, a thickness of 100 μm, and a diameter of 2 inch. As a layer to enhance the adherence of an adhesion layer and to prevent interdiffusion between the ohmic positive electrode and the adhesion layer in order not to degrade their functions, Ti/Pt were deposited on the surface of the metal support by 500 Å/500 Å by vacuum deposition, and heat-treated under nitrogen atmosphere at 350° C. for 30 minutes.

As the adhesion layer, an Au—Sn alloy layer (Au: 80%-Sn: 20%) having a thickness of 10000 Å was formed by vacuum deposition. An adherence-enhancing layer and adhesion layer having the same layered structure as that formed on the Mo support were formed on the NiAu ohmic positive electrode of the epitaxial substrate by photolithography, lift-off method and vacuum deposition.

The adhesion layer of the group 3-5 nitride semiconductor and the adhesion layer of the Mo support were bound by vacuum thermocompression bonding under the conditions of pressure: $1 \times 10^{-3}$ Torr or less, temperature: 300° C., retention time: 5 minutes, and load: 6000 N.

The sample (obtained by binding the group 3-5 nitride semiconductor and the support) was fixed to a stage by vacuum adsorption. The sample on the stage was scanned linearly at scan of 350 mm/sec. After the scanning of one line, the stage was moved in a horizontal direction by 15 μm, and the scanning was repeated linearly to irradiate the entire surface of the sample with light. The light was obtained by converting a triple harmonic from a CW-excited $YVO_4$ laser (wavelength: 355 nm) to a pulse with a frequency of 15 kHz with a chopper and had a Q-switching pulse width of about 8 ns, an oscillation mode of $TEM_{00}$, and an output of the triple harmonic of 0.26 W (laser-driven current: 19.5 A) at the sample surface. And further, the light was applied from the sapphire substrate side and was defocused so that its focus was changed to a place 450 μm away from the sapphire/GaN epitaxial interface to the GaN side.

The sample was observed from the sapphire side after the light irradiation. The entire surface near the interface between the sapphire substrate and the GaN layer turned from transparent to gray. Then the sapphire substrate was separated therefrom by throwing the sample in water of 100° C.

On the surface of the GaN layer from which the sapphire substrate was separated, an Al/Pt/Ni mesh electrode was formed as an ohmic negative electrode. To form the electrode, BHF cleaning, the removal of Ga remaining on the surface of the group 3-5 nitride semiconductor using polishing, the removal of the low-quality crystal layer, and the planarization of the surface were carried out. Then resist application, resist baking, pattern exposure, and pattern development were carried out on the surface. Thereafter, Al, Pt, and Ni were deposited with vacuum coater by 2000 Å, 500 Å, and 800 Å, respectively, to form an electrode pattern by the lift-off method. The Al/Pt/Ni ohmic negative electrode was formed which had a diameter of 200 μm, a mesh width of 2 μm, a mesh pitch of 25 μm, an electrode pad of 50 μm square, and an opening ratio of 85% to obtain a group 3-5 nitride semiconductor vertical light emitting device including the Mo electrically conductive support.

The light emitting device emitted a clear blue light at a driving current of 20 mA. And further, the light emitting device had a high light output and emitted a clear blue light with a driving current of 200 mA.

Comparative Example 1

The same operation as Example 1 was carried out except that no inorganic particle was used to obtain a group 3-5 nitride semiconductor vertical light emitting device including a Mo electrically conductive support.

Like Example 1, a sample was irradiated with a light having a laser irradiation output of 0.26 W (laser-driven current: 19.5 A). The sample was observed from the sapphire side after the light irradiation. The entire surface near the interface between the sapphire substrate and the GaN layer was transparent. The sample was thrown in water of 100° C., but the sapphire substrate was not separated therefrom.

Comparative Example 2

The same operation as Example 1 was carried out except that no inorganic particle was used to obtain a group 3-5 nitride semiconductor vertical light emitting device including a Mo electrically conductive support.

Like Example 1, a sample was irradiated with a light having a laser irradiation output of 0.39 W (laser-driven current: 22.5 A). The sample was observed from the sapphire side after the light irradiation. The entire surface near the interface between the sapphire substrate and the GaN layer was transparent. The sample was thrown in water of 100° C., but the sapphire substrate was not separated therefrom.

Comparative Example 3

The same operation as Example 1 was carried out except that no inorganic particle was used to obtain a group 3-5 nitride semiconductor vertical light emitting device including a Mo electrically conductive support.

Like Example 1, a sample was irradiated with a light having a laser irradiation output of 0.42 W (laser-driven current: 24 A). The sample was observed from the sapphire side after the light irradiation. The entire surface near the interface between the sapphire substrate and the GaN layer turned from transparent to gray. The sapphire substrate was separated therefrom by throwing the sample in water of 100° C. The light emitting device did not emit a light at a driving current of 20 mA.

Example 2

As a substrate, a mirror polished c-face sapphire substrate was used. As inorganic particles, silica particles were used which were contained in colloidal silica (Trade Name "SEAHOSTAR KE-W50" manufactured by Nippon Shokubai Co., Ltd., average particle diameter: 550 nm). The substrate was set onto a spinner, the colloidal silica with a silica content of 20% by weight was applied onto the substrate, and the colloidal suspension was spin-dried. From the observation using a SEM, the coverage of the silica particles on the surface of the substrate was 60%.

A group 3-5 nitride semiconductor was epitaxially grown on the substrate by atmospheric pressure MOVPE under the following conditions and the silica particles were embedded in the group 3-5 nitride semiconductor layer. A GaN low-temperature buffer layer having a thickness of about 500 Å was grown thereon by supplying carrier gas, ammonia, and TMG under the conditions of pressure: 1 atmospheric pressure, susceptor temperature: 485° C., and carrier gas: hydrogen gas. An GaN layer in which facets are to be formed was grown thereon by changing the susceptor temperature to 900° C. and supplying a carrier gas, ammonia, TMG, and silane. A GaN layer was grown by changing the susceptor temperature to 1040° C., changing the pressure to ¼ atmospheric pressure, and supplying carrier gas, ammonia, TMG, and silane. Thereafter, an n-type layer made of GaN, a barrier layer and well layer (with a multiple quantum well structure) having a double heterostructure made of GaN and InGaN, a cap layer made of GaN and AlGaN, and a p-type layer made of GaN were grown to obtain a group 3-5 nitride semiconductor which emitted blue light.

In the following, the same operation as Example 1 was carried out to obtain a group 3-5 nitride semiconductor vertical light emitting device including a Mo electrically conductive support.

The light emitting device emitted a clear blue light at a driving current of 20 mA. The light emitting device had a high light output and emitted a clear blue light with a driving current of 200 mA.

Example 3

As a substrate, a mirror polished c-face sapphire substrate was used. As inorganic particles, silica particles were used which were contained in colloidal silica (Trade Name "SEAHOSTAR KE-W50" manufactured by Nippon Shokubai Co., Ltd., average particle diameter: 550 nm). The substrate was set onto a spinner, the colloidal silica with a silica content of 20% by weight was applied onto the substrate, and the colloidal suspension was spin-dried. From the observation using a SEM, the coverage of the silica particles on the surface of the substrate was 60%.

A group 3-5 nitride semiconductor was epitaxially grown on the substrate by atmospheric pressure MOVPE under the following conditions and the silica particles were embedded in the group 3-5 nitride semiconductor layer. A GaN buffer layer having a thickness of about 500 Å was grown thereon by supplying carrier gas, ammonia, and TMG under the conditions of pressure: 1 atmospheric pressure, susceptor temperature: 485° C., and carrier gas: hydrogen gas. A GaN layer was grown thereon by changing the susceptor temperature to 900° C. and supplying a carrier gas, ammonia, and TMG. A GaN layer was grown by changing the susceptor temperature to 1040° C., changing the pressure to ¼ atmospheric pressure, and supplying carrier gas, ammonia, and TMG. Thereafter, an n-type layer made of GaN, a barrier layer and well layer (with a multiple quantum well structure) having a double heterostructure made of GaN and InGaN, a cap layer made of GaN and AlGaN, and a p-type layer made of GaN, a $n^+$-type layer made of InGaN were grown to obtain a group 3-5 nitride semiconductor having a thickness epitaxial crystal of 20 μm which emitted blue light.

The group 3-5 nitride semiconductor was heat-treated under $N_2$ atmosphere at 700° C. for 20 minutes to make the p-type layer have a low electric resistance. Then, in order to form an ohmic $n^+$ electrode on the surface of the group 3-5 nitride semiconductor, the surface was ultrasonically cleaned with an acetone solution, washed with hot aqua regia (60° C.), and ultrasonically cleaned with ultrapure water. ITO was deposited thereon by 120 nm with vacuum coater. Resist application, resist baking, pattern exposure, and pattern development were carried out on the surface thereof. Thereafter, etching was carried out with a mixed solution of ferric chloride solution and hydrochloric acid at a 1:1 ratio to form an ITO electrode as an ohmic $n^+$ electrode. After the formation of the pattern, the remaining resist was removed therefrom.

On the surface of the n-type layer-exposing region of the group 3-5 nitride semiconductor, resist application, resist baking, pattern exposure (the formation of a pattern for element isolation), and pattern development were carried out to form a pattern thereon. Thereafter, the epitaxial crystal was ICP dry etched by a depth at which the surface of the n-type layer was exposed (mesa-shaped portions were formed). The ICP dry etching was carried out under the conditions of etching gas: mixed gas of $Cl_2$, $CH_2Cl_2$, and Ar; flow rate: 20, 10, and 40 sccm, respectively; pressure: 0.8 Pa, ICP power: 200

W, and bias power: 100 W. After the dry etching, the extra mask was removed with an organic solvent.

On the exposed n-type layer surface, resist application, resist baking, pattern exposure, and pattern development were carried out. V was deposited by 10 nm, and Al was deposited by 100 nm using a vacuum coater. Thereafter, a V/Al electrode pattern was formed by a lift-off method for the formation of an ohmic negative electrode.

Separation grooves for the epitaxial crystal including the group 3-5 nitride semiconductor were prepared by laser light irradiation. The laser light was obtained by converting a triple harmonic from a CW-excited YVO$_4$ laser (wavelength: 355 nm) to a pulse with a frequency of 35 kHz with a chopper and had a Q-switching pulse width of about 8 ns, an oscillation mode of TEM$_{00}$, and an output of the triple harmonic of about 0.2 W. The laser light was applied from the epitaxial crystal side and was focused onto the crystal surface. The separation grooves had a groove width of 20 μm or less. The sample on the stage was scanned at a rate of 10 mm/sec. After the scanning of five lines, the stage was moved in a horizontal direction by the device size of 420 μm. Through the repetition of such operation, the epitaxial crystal was irradiated with laser light in mesh form, whereby it was divided into plural regions each having a size of 420×420 μm.

The sample (the group 3-5 nitride semiconductor) was fixed to a stage by vacuum adsorption. The sample on the stage was scanned linearly at scan of 350 mm/sec. After the scanning of one line, the stage was moved in a horizontal direction by 15 μm, and the scanning was repeated linearly to irradiate the entire surface of the sample with light. The light was obtained by converting a triple harmonic from a CW-excited YVO$_4$ laser (wavelength: 355 nm) to a pulse with a frequency of 15 kHz with a chopper and had a Q-switching pulse width of about 8 ns, an oscillation mode of TEM$_{00}$, and an output of the triple harmonic of 0.26 W (laser-driven current: 19.5 Å) at the sample surface. And further, the light was applied from the sapphire substrate side and was defocused so that its focus was changed to a place 450 μm away from the sapphire/GaN epitaxial interface to the GaN side.

After the light irradiation, the sample was observed from the sapphire substrate side. The entire surface near the interface between the sapphire substrate and the GaN layer had turned from transparent to gray.

The sample was placed on the center of a piece of resin tape about 4 inch wide fixed on a ring-shaped jig. The resin tape included a PVC-acrylic base film having a thickness of about 70 μm and an adhesive layer having a thickness of about 10μ thick with an adhesive strength of 18 gf/25 mm on the base film. As those substances, a film and an adhesive layer were used which were thin and had poor adhesion.

The sample, which was placed on the resin tape with the surface side of its epitaxial crystal adhered to the tape, was heated to about 60° C., whereby the sapphire substrate was removed therefrom. At this step, the release surface of the epitaxial crystal on the resin tape was dipped in a buffered hydrofluoric acid (BHF) for 10 min, whereby the remaining Ga was removed.

The sample on the resin tape which had the release surface as an upper side was moved on the other resin tape made of substance same as the above resin, and the sample had the epitaxial crystal surface as an upper side.

The obtained group 3-5 nitride semiconductor horizontal light emitting device emitted a clear blue light at a driving current of 20 mA. And further, the light emitting device had a high light output and emitted a clear blue light with a driving current of 200 mA.

Comparative Example 4

The same operation as Example 3 was carried out except that no inorganic particle was used to obtain a group 3-5 nitride semiconductor horizontal light emitting device including a Mo electrically conductive support.

Like Example 3, a sample was irradiated with a light having a laser irradiation output of 0.26 W (laser-driven current: 19.5 A). The sample was observed from the sapphire side after the light irradiation. The entire surface near the interface between the sapphire substrate and the GaN layer was transparent. The sample was heated at 60° C. The sapphire substrate was not separated therefrom.

Comparative Example 5

The same operation as Example 3 was carried out except that no inorganic particle was used to obtain a group 3-5 nitride semiconductor horizontal light emitting device including a Mo electrically conductive support.

Like Example 3, a sample was irradiated with a light having a laser irradiation output of 0.39 W (laser-driven current: 22.5 A). The sample was observed from the sapphire side after the light irradiation. The entire surface near the interface between the sapphire substrate and the GaN layer was transparent. The sample was heated at 60° C. The sapphire substrate was not separated therefrom.

Comparative Example 6

The same operation as Example 3 was carried out except that no inorganic particle was used to obtain a group 3-5 nitride semiconductor horizontal light emitting device including a Mo electrically conductive support.

Like Example 3, a sample was irradiated with a light having a laser irradiation output of 0.42 W (laser-driven current: 24 A). The sample was observed from the sapphire side after the light irradiation. The entire surface near the interface between the sapphire substrate and the GaN layer turned transparent to gray. The sample was heated at 60° C. The sapphire substrate was separated therefrom.

The obtained group 3-5 nitride semiconductor horizontal light emitting device did not emit a light at a driving current of 20 mA.

Example 4

As a substrate, a mirror polished c-face sapphire substrate was used. As inorganic particles, silica particles were used which were contained in colloidal silica (Trade Name "SEAHOSTAR KE-W50" manufactured by Nippon Shokubai Co., Ltd., average particle diameter: 550 nm). The substrate was set onto a spinner, the colloidal silica with a silica content of 20% by weight was applied onto the substrate, and the colloidal suspension was spin-dried. From the observation using a SEM, the coverage by the silica particles on the surface of the substrate was 60%.

A group 3-5 nitride semiconductor was epitaxially grown on the substrate by atmospheric pressure MOVPE under the following conditions and the silica particles were embedded in the group 3-5 nitride semiconductor layer. A GaN buffer layer having a thickness of about 500 Å was grown thereon by supplying carrier gas, ammonia, and TMG under the conditions of pressure: 1 atmospheric pressure, susceptor temperature: 485° C., and carrier gas: hydrogen gas. An GaN layer was grown thereon by changing the susceptor temperature to 900° C. and supplying a carrier gas, ammonia, and TMG. An GaN layer was grown by changing the susceptor temperature to 1040° C., changing the pressure to ¼ atmospheric pressure, and supplying carrier gas, ammonia, and TMG. Thereafter, an n-type layer made of GaN, barrier layers and well layers (with multiple quantum well structure) having a double heterostructure made of GaN and InGaN, cap layers made of GaN and AlGaN, a p-type layer made of GaN, and a n$^+$-type layer made of InGaN were grown to obtain a group 3-5 nitride semiconductor including an epitaxial crystal having a thickness of 20 μm which emitted blue light.

The group 3-5 nitride semiconductor was heat-treated under $N_2$ atmosphere at 700° C. for 20 minutes to make the p-type layer have a low electric resistance. Then, in order to form an ohmic n$^+$ electrode on the surface of the group 3-5 nitride semiconductor, the surface was ultrasonically cleaned with an acetone solution, washed with hot aqua regia (60° C.), and ultrasonically cleaned with ultrapure water. ITO was deposited thereon by 120 nm with vacuum coater. Resist application, resist baking, pattern exposure, and pattern development were carried out on the surface thereof. Thereafter, etching was carried out with a mixed solution of ferric chloride solution and hydrochloric acid at a 1:1 ratio to form an ITO electrode as an ohmic n$^+$ electrode. After the formation of the pattern, the remaining resist was removed therefrom.

Separation grooves for the epitaxial crystal including the group 3-5 nitride semiconductor were prepared by laser light irradiation. The laser light was obtained by converting a triple harmonic from a CW-excited YVO$_4$ laser (wavelength: 355 nm) to a pulse with a frequency of 35 kHz with a chopper and had a Q-switching pulse width of about 8 ns, an oscillation mode of TEM$_{00}$, and an output of the triple harmonic of about 0.2 W. The laser light was applied from the epitaxial crystal side and was focused onto the crystal surface. The separation grooves had a groove width of 20 μm or less. The sample on the stage was scanned at a rate of 10 mm/sec. After the scanning of five lines, the stage was moved in a horizontal direction by the device size of 420 μm. Through the repetition of such operation, the epitaxial crystal was irradiated with laser light in mesh form, whereby it was divided into plural regions each having a size of 420×420 μm.

The sample (the group 3-5 nitride semiconductor) was fixed to a stage by vacuum adsorption. The sample on the stage was scanned linearly at scan of 350 mm/sec. After the scanning of one line, the stage was moved in a horizontal direction by 15 μm, and the scanning was repeated linearly to irradiate the entire surface of the sample with light. The light was obtained by converting a triple harmonic from a CW-excited YVO$_4$ laser (wavelength: 355 nm) to a pulse with a frequency of 15 kHz with a chopper and had a Q-switching pulse width of about 8 ns, an oscillation mode of TEM$_{00}$, and an output of the triple harmonic of 0.26 W (laser-driven current: 19.5 A) at the sample surface. And further, the light was applied from the sapphire substrate side and was defocused so that its focus was changed to a place 450 μm away from the sapphire/GaN epitaxial interface to the GaN side.

After the light irradiation, the sample was observed from the sapphire substrate side. The entire surface near the interface between the sapphire substrate and the GaN layer had turned from transparent to gray.

The sample was placed on the center of a piece of resin tape about 4 inch wide fixed on a ring-shaped jig. The resin tape included a PVC-acrylic base film having a thickness of about 70 μm and an adhesive layer having a thickness of about 10μ thick with an adhesive strength of 18 gf/25 mm on the base film. As those substances, a film and an adhesive layer were used which were thin and had poor adhesion.

The sample, which was placed on the resin tape and had sapphire substrate as an upper side, and epitaxial crystal surface as a lower side adhered to the resin tape, was heated to about 60° C., whereby the sapphire substrate was removed therefrom. At this step, the release surface of the epitaxial crystal on the resin tape was dipped in a buffered hydrofluoric acid (BHF) for 10 min, whereby the remaining Ga was removed.

The sample on the resin tape which had the release surface as the upper side was moved on the other resin tape made of substance same as the above resin, and the sample had the epitaxial crystal surface as the upper side.

The obtained group 3-5 nitride semiconductor horizontal light emitting device emitted a clear blue light at a driving current of 20 mA. And further, the light emitting device had a high light output and emitted a clear blue light with a driving current of 200 mA.

Example 5

As a substrate, a mirror polished GaN substrate is used. As inorganic particles, silica particles are used which are contained in colloidal silica (Trade Name "SEAHOSTAR KE-W50" manufactured by Nippon Shokubai Co., Ltd., average particle diameter: 550 nm). The substrate is set onto a spinner, the colloidal silica with a silica content of 20% by weight is applied onto the substrate, and the colloidal suspension is spin-dried.

A group 3-5 nitride semiconductor is epitaxially grown on the substrate by MOVPE under the following conditions and the silica particles are embedded in the group 3-5 nitride semiconductor layer. A InGaN buffer layer is grown thereon by supplying carrier gas, ammonia, TMG, and TMI under the conditions of pressure: 1 atmospheric pressure, susceptor temperature: 485° C., and carrier gas: nitrogen gas. An GaN layer is grown thereon by changing the susceptor temperature to 900° C. and supplying a carrier gas, ammonia, and TMG. An GaN layer is grown by changing the susceptor temperature to 1040° C., changing the pressure to ¼ atmospheric pressure, and supplying carrier gas, ammonia, and TMG. Thereafter, an n-type layer made of GaN, barrier layers and well layers (with multiple quantum well structure) having a double heterostructure made of GaN and InGaN, cap layers made of GaN and AlGaN, a p-type layer made of GaN, and a n$^+$-type layer made of GaN are grown to obtain a group 3-5 nitride semiconductor including an epitaxial crystal having a thickness of 20 μm which emits blue light.

The group 3-5 nitride semiconductor is heat-treated under $N_2$ atmosphere at 700° C. for 20 minutes to make the p-type layer have a low electric resistance. Then, in order to form an ohmic n$^+$ electrode on the surface of the group 3-5 nitride semiconductor, the surface is ultrasonically cleaned with an acetone solution, washed with hot aqua regia (60° C.), and ultrasonically cleaned with ultrapure water. ITO is deposited thereon by 120 nm with vacuum coater. Resist application, resist baking, pattern exposure, and pattern development are carried out on the surface thereof. Thereafter, etching is carried out with a mixed solution of ferric chloride solution and hydrochloric acid at a 1:1 ratio to obtain an ITO electrode as the ohmic n$^+$ electrode. After the formation of the pattern, the remaining resist is removed therefrom.

On the surface of the n-type layer-exposure region of the group 3-5 nitride semiconductor, resist application, resist baking, pattern exposure (the formation of a pattern for device isolation), and pattern development are conducted to form a pattern thereon. Thereafter, the epitaxial crystal is ICP dry etched by a depth at which the surface of the n-type layer is exposed (mesa-shaped portions are formed). After the dry etching, the extra mask is removed with an organic solvent.

On the exposed surface of the n-type layer, resist application, resist baking, pattern exposure, and pattern development are carried out. Thereafter, through the use of a vacuum coater, V and Al are deposited thereon by 10 nm and 100 nm, respectively, and then a V/Al electrode pattern is formed as the ohmic negative electrode by lift-off method.

Separation grooves for the epitaxial crystal including the group 3-5 nitride semiconductor are formed by laser light irradiation. The laser light is obtained by converting a triple harmonic from a CW-excited $YVO_4$ laser (with a wavelength of 355 nm) to a pulse wave with a frequency of 35 kHz with a chopper and had a Q-switching pulse width of about 8 ns, an oscillation mode of $TEM_{00}$, and the output of the triple harmonic of about 0.2 W at the sample surface. The laser light is applied from the epitaxial crystal side and is focused onto the crystal surface. The sample on the stage was scanned at a rate of 10 mm/sec. After the scanning of five lines, the stage is moved in a horizontal direction by the device size of 420 μm. Through the repetition of such operation, the epitaxial crystal is irradiated with laser light in mesh form, whereby it is divided into plural regions each having a size of 420×420 μm.

The sample (the group 3-5 nitride semiconductor) is fixed to the stage by vacuum adsorption, and is scanned linearly at a rate of 350 mm/sec. After the scanning of one line, the stage is moved in a horizontal direction by 15 μm. The scanning is repeated linearly to irradiate the entire surface of the sample with light. The light is obtained by converting a double harmonic from a CW-excited $YVO_4$ laser (with a wavelength of 532 nm) to a pulse wave. In addition, the light is applied from the GaN substrate side, and is defocused such that it is focused onto a place away from the epitaxial interface between the GaN substrate and the epitaxial crystal to the epitaxial crystal side.

The sample is placed on the center of a piece of resin tape about 4 inch wide fixed on a ring-shaped jig. The resin tape includes a PVC-acrylic base film having a thickness of about 70 μm and an adhesive layer having a thickness of about 10μ thick with an adhesive strength of 18 gf/25 mm on the base film. As those substances, a film and an adhesive layer are used which were thin and have poor adhesion.

The sample, which is placed on the resin tape and has GaN substrate as an upper side, and epitaxial crystal surface as a lower side adhered to the resin tape, is heated, whereby the GaN substrate is removed therefrom. At this step, a residue on the release surface of the GaN substrate placed on the resin tape is removed.

The sample on the resin tape which has the release surface as the upper side was moves on the other resin tape made of substance same as the above resin, and the sample has the epitaxial crystal surface as the upper side.

The obtained group 3-5 nitride semiconductor horizontal light emitting device emits clear light with a driving current of 20 mA. The light emitting device has a high light output and emits a clear blue light with a driving current of 200 mA.

The recovered GaN substrate may be reused as a substrate after mirror-polishing its surface.

Industrial Applicability

According to the present invention, a method for producing a light emitting device with a high light output is provided. And further, the invention provides a method for producing a group 3-5 nitride semiconductor having no substrate and suitably used for the light emitting device.

The invention claimed is:

1. A method for producing a group 3-5 nitride semiconductor, comprising the steps of (i), (ii), and (iii) in this order:
    (i) placing spherical inorganic particles directly on a substrate consisting of sapphire, SiC, Si, $MgAl_2O_4$, $LiTaO_3$, $ZrB_2$, GaN, or AlN to form a mask, wherein the placement is carried out by a method of dipping the substrate in a slurry containing the inorganic particles and a medium, or a method of applying or spraying the slurry onto the substrate and then drying the slurry,
    (ii) epitaxially growing a semiconductor layer by using said mask formed from said inorganic particles whereby said inorganic particles are embedded in the semiconductor layer, the semiconductor layer having a form of a multilayer and including a low temperature grown buffer layer having a thickness from 100 Å to 5000 Å adjacent to the substrate, and
    (iii) separating the substrate and the semiconductor layer by irradiating the interface between the substrate and the semiconductor layer with light, wherein the light is further irradiated to the inorganic particles.

2. The method according to claim 1, wherein the substrate used at the step (i) consists of sapphire or SiC.

3. The method according to claim 1, wherein the substrate used at the step (i) is transparent.

4. The method according to claim 1, wherein the inorganic particles include at least one selected from the group consisting of oxide, nitride, carbide, boride, sulfide, selenide, and metal.

5. The method according to claim 1, wherein the inorganic particles has an average particle diameter of from 5 nm to 50 μm.

6. The method according to claim 1, wherein the semiconductor layer used at the step (ii) includes a group 3-5 nitride.

7. The method according to claim 1, wherein the growth is carried out by metalorganic vapor phase epitaxy, molecular beam epitaxy, or hydride vapor phase epitaxy.

8. The method according to claim 1, wherein the light is a laser light.

9. The method according to claim 3, wherein the substrate includes at least one selected from sapphire, GaN, and AlN.

10. The method according to claim 4, wherein the oxide includes at least one selected from the group consisting of silica, alumina, zirconia, titania, ceria, zinc oxide, tin oxide, and yttrium aluminum garnet.

11. The method according to claim 10, wherein the oxide is silica.

12. The method according to claim 6, wherein the step (ii) further comprising the substeps of growing an n-type layer, growing an active layer, and growing a p-type layer.

13. A method for producing a light emitting device, comprising the steps of (i), (ii), (iii) and (iv) in this order:
    (i) placing spherical inorganic particles directly on a substrate consisting of sapphire, SiC, Si, $MgAl_2O_4$, $LiTaO_3$, $ZrB_2$, GaN, or AlN to form a mask, wherein the placement is carried out by a method of dipping the substrate in a slurry containing the inorganic particles and a medium, or a method of applying or spraying the slurry onto the substrate and then drying the slurry,
    (ii) epitaxially growing a semiconductor layer by using said mask formed from said inorganic particles whereby said inorganic particles are embedded in said semiconductor layer, the semiconductor layer having a form of a multilayer and including a low temperature grown buffer layer having a thickness from 100 Å to 5000 Å adjacent to the substrate, and (iii) separating the substrate and the semiconductor layer by irradiating the interface between the substrate and the semiconductor layer with light, wherein the light is further irradiated to the inorganic particles, and (iv) forming electrodes.

14. The method according to claim 13, wherein the step (ii) comprises the substeps of growing an n-type layer, growing an active layer, and growing a p-type layer.

15. A method for producing a group 3-5 nitride semiconductor, comprising the steps of (i), (ii), and (iii) in this order:

(i) placing spherical inorganic particles directly on a substrate consisting of sapphire, SiC, Si, $MgAl_2O_4$, $LiTaO_3$, $ZrB_2$, GaN, or AlN to form a mask, wherein the placement is carried out by a method of dipping the substrate in a slurry containing the inorganic particles and a medium, or a method of applying or spraying the slurry onto the substrate and then drying the slurry, (ii) epitaxially growing a semiconductor layer by using said mask formed from said inorganic particles wherein a penetration region in the semiconductor layer adjoining the interface between the semiconductor layer and the substrate is formed, and the inorganic particles are embedded in the penetration region in the semiconductor layer, the semiconductor layer having a form of a multilayer and including a low temperature grown buffer layer having a thickness from 100 Å to 5000 Å adjacent to the substrate, and (iii) separating the substrate and the semiconductor layer by irradiating the adjoining penetration region and the interface between the substrate and the semiconductor layer with light, wherein embedded inorganic particles are irradiated.

* * * * *